United States Patent
Suzuki

(10) Patent No.: US 8,046,395 B2
(45) Date of Patent: Oct. 25, 2011

(54) NORMALIZATION PROCESSING APPARATUS

(75) Inventor: Koichi Suzuki, Kodaira (JP)

(73) Assignee: Canon Kabushiki Kaisha, Tokyo (JP)

( * ) Notice: Subject to any disclaimer, the term of this patent is extended or adjusted under 35 U.S.C. 154(b) by 1017 days.

(21) Appl. No.: 11/924,866

(22) Filed: Oct. 26, 2007

(65) Prior Publication Data

US 2008/0104154 A1  May 1, 2008

(30) Foreign Application Priority Data

Oct. 31, 2006  (JP) .................................. 2006-296501

(51) Int. Cl.
*G06F 5/01* (2006.01)

(52) U.S. Cl. ..................................................... 708/205

(58) Field of Classification Search .................. None
See application file for complete search history.

(56) References Cited

U.S. PATENT DOCUMENTS

| 6,765,515 | B2 * | 7/2004 | Miyamoto | 341/107 |
| 7,495,588 | B2 * | 2/2009 | Otsuka | 341/107 |
| 7,528,749 | B2 * | 5/2009 | Otsuka | 341/107 |
| 2003/0217085 | A1 * | 11/2003 | Miyamoto | 708/205 |
| 2005/0156762 | A1 * | 7/2005 | Tsuru | 341/107 |
| 2005/0270192 | A1 * | 12/2005 | Tsuru | 341/50 |
| 2008/0100479 | A1 * | 5/2008 | Otsuka | 341/60 |
| 2008/0100480 | A1 * | 5/2008 | Otsuka | 341/60 |
| 2008/0104154 | A1 * | 5/2008 | Suzuki | 708/209 |

OTHER PUBLICATIONS

Mo Li, Wuchen Wu, A High Throughput Binary Arithmetic Coding Engine for h.264/AVC, 2006.

* cited by examiner

*Primary Examiner* — David H Malzahn
(74) *Attorney, Agent, or Firm* — Canon U.S.A. Inc., I.P. Division

(57) ABSTRACT

A normalization processing apparatus according to an embodiment of the present invention can calculate all of normalization processing output values, that is, the output value of the size of a region, the output value of the lowest value in the region, the output value of the number of non-output bits, and an output bit string, at the same time using a shift amount and the prefix and suffix of the output bit string. The shift amount is calculated using an input value of the size of the region. The prefix and the suffix are calculated using an input value of the lowest value in the region and an input value of the number of non-output bits.

8 Claims, 6 Drawing Sheets

NORMALIZATION PROCESSING APPARATUS

CROSS REFERENCE TO RELATED APPLICATIONS

This application claims the benefit of Japanese Patent Application No. 2006-296501, filed on Oct. 31, 2006, which is hereby incorporated by reference herein its entirety.

BACKGROUND OF THE INVENTION

1. Field of the Invention

The present invention relates to a normalization processing technique used in arithmetic coding.

2. Description of the Related Art

Recently, H.264 has been standardized as a moving image compression coding method. This H.264 coding method requires a larger amount of computation as compared with known compression coding methods such as MPEG-2 and MPEG-4, but can achieve higher coding efficiency. In this H.264 coding method, the Context-based Adaptive Binary Arithmetic Coding (CABAC) method is defined as a variable length coding method (see, ITU-T H.264 "Advanced video coding for generic audiovisual services").

In arithmetic coding, a symbol sequence is mapped between 0.0 and 1.0 on the number line, and its coordinates are coded into a codeword expressed in binary notation.

It is assumed that an occurrence probability of a symbol "1" is defined as "r", an occurrence probability of a symbol "0" is defined as "1−r", a range of the symbol sequence on the number line at the Ith point is defined as "codlRange", and the minimum coordinates in the range are defined as "codlLow". When an occurring symbol is the symbol "0", codlRange and codlLow are updated as follows.

$$codlRange=(1-r)*codlRange$$

$$codlLow=codlLow+r*codlRange$$

On the other hand, when an occurring symbol is the symbol "1", codlRange and codlLow are updated as follows.

$$codlRange=r*codlRange$$

$$codlLow=codlLow$$

As mapping is continuously repeated, the range codlRange becomes smaller. Accordingly, normalization processing is required to be performed so as to maintain computation accuracy.

A normalization process based on the CABAC method is illustrated in FIG. 2. The range on the number line codlRange, the minimum coordinates in the range codlLow, the number of non-output bits bitsOutStanding, and a flag indicating whether an output bit is the first bit of a slice firstBitFlag are input.

After the normalization process has been performed, the range on the number line codlRange, the minimum coordinates in the range codlLow, the number of non-output bits bitsOutStanding, the flag indicating whether an output bit is the first bit of a slice firstBitFlag, and a coded bit string are output.

In step S201, it is determined whether the value of codlRange is less than 0x100. If the value of codlRange is equal to or greater than 0x100, the normalization process ends. If the value of codlRange is less than 0x100, the process proceeds to step S202.

In step S202, it is determined whether the value of codlLow is less than 0x100. If the value of codlLow is less than 0x100, the process proceeds to step S204. In step 204, a function PutBit(0) to be described later is executed. Subsequently the process proceeds to step S208. On the other hand, if it is determined in step S202 that the value of codlLow is equal to or greater than 0x100, the process proceeds to step S203 in which it is determined whether the value of codlLow is equal to or greater than 0x200.

If the value of codlLow is less than 0x200, the process proceeds to step S205 in which 0x100 is subtracted from the value of codlLow.

Furthermore, the value of bitsOutStanding is incremented, and the process proceeds to step S208. On the other hand, if it is determined in step S203 that the value of codlLow is equal to or greater than 0x200, the process proceeds to step S206 in which 0x200 is subtracted from the value of codlLow. Subsequently, the process proceeds to step S207.

In step S207, a function PutBit(1) to be described later is executed. Subsequently, the process proceeds to step S208 in which the values of codlRange and codlLow are individually shifted to the left by one bit so as to obtain values each double the original value thereof. Subsequently, the process returns to step S201.

Next, a function PutBit(B) will be described with reference to FIG. 3. The value of an argument B is 0 (step S204) or 1 (step S207). In step S301, it is determined whether the value of firstBitFlag is not zero. If the value of firstBitFlag is not zero (i.e. firstBitFlag !=0 is true), the process proceeds to step S302. In step S302, the value of firstBitFlag is set to zero. Subsequently, the process proceeds to step S304. On the other hand, if it is determined in step S301 that the value of firstBitFlag is zero (i.e., firstBitFlag !=0 is false), the process proceeds to step S303. In step S303, one bit whose bit value is B is output. Subsequently, the process proceeds to step S304.

In step S304, it is determined whether the value of bitsOutStanding is greater than zero. If the value of bitsOutStanding is equal to or less than zero, the process ends. If the value of bitsOutStanding is greater than zero, the process proceeds to step S305. In step S305, one bit whose bit value is 1−B is output and the value of bitsOutStanding is decremented. The process then returns to step S304.

An example of a known normalization processing apparatus is illustrated in FIG. 10. A storage unit 1001 is a register array for storing the signals codlRange, codlLow, bitsOutStanding, and firstBitFlag and an output bit string. A determination device 1002 compares the value of the signal codlRange stored in the storage unit 1001 with 0x100.

If the value of the signal codlRange is equal to or greater than 0x100, the determination device 1002 transfers data stored in the storage unit 1001 to an output device 1004. If the value of the signal codlRange is less than 0x100, the determination device 1002 transfers the data stored in the storage unit 1001 to a bit string calculation device 1003.

The bit string calculation device 1003 is a circuit for performing the process from step S202 to step S208 in the flowchart illustrated in FIG. 2. The bit string calculation device 1003 calculates the values of the signals codlRange, codlLow, bitsOutStanding, and firstBitFlag, and transfers these calculation results and the output bit string to the storage unit 1001. As a result, the data stored in the storage unit 1001 is updated.

The output device 1004 is a circuit for externally outputting the signals codlRange, codlLow, bitsOutStanding, and firstBitFlag and the output bit string which have been transferred from the determination device 1002.

In the above-described known normalization process, however, each time the bit string calculation device 1003 doubles the value of the signal codlRange, the bit string calculation device 1003 is required to transfer the calculated value of the signal codlRange to the storage unit 1001 so as to cause the determination device 1002 to determine whether the process should be finished (end determination). Accordingly, the normalization process cannot be performed upon all pieces of corresponding data at the same time, and therefore coding and decoding cannot be performed rapidly.

For example, if the value of the signal codlRange is one, the update of data stored in the storage unit 1001 and the end determination performed by the determination device 1002 are repeated eight times. If the determination device 1002 is a circuit requiring one cycle for the end determination, eight cycles are required for the normalization process of all pieces of corresponding data.

On the other hand, a case can be considered in which output values corresponding to all of the signals codlRange, codlLow, firstBitFlag, and bitsOutStanding are prepared in advance in the form of a table. In this case, however, a large-capacity memory is required and a normalization processing apparatus including such a memory becomes more expensive.

SUMMARY OF THE INVENTION

The present invention provides a normalization processing apparatus capable of rapidly performing a normalization process upon all pieces of corresponding data at the same time without using a large-capacity memory.

A normalization processing apparatus according to an aspect of the present invention receives an input value of a size of a region on the number line which is determined based on an occurrence probability value of a current symbol, an input value of the lowest value in the region, and an input value of the number of non-output bits, and performs normalization processing in arithmetic coding using the received input values. The normalization processing apparatus includes: a shift amount calculation unit configured to calculate a shift amount required for the input value of the size of the region to become equal to or greater than a setting value; a shift unit configured to perform shift processing upon the input value of the size of the region and the input value of the lowest value in the region based on the calculated shift amount; a prefix generation unit configured to calculate a prefix of an output bit string using the input value of the number of non-output bits and the input value of the lowest value in the region; a suffix generation unit configured to calculate a suffix of the output bit string using the input value of the lowest value in the region; a non-output bit calculation unit configured to calculate an output value of the number of non-output bits using the input value of the number of non-output bits, the input value of the lowest value in the region, and the calculated shift amount; and a bit string coupling unit configured to combine the prefix and the suffix to generate the output bit string using the calculated shift amount and the output value of the number of non-output bits, and to output the generated output bit string.

According to aspect of the present invention, a normalization processing apparatus can calculate all of normalization processing output values, that is, the output value of the size of a region, the output value of the lowest value in the region, the output value of the number of non-output bits, and an output bit string, at the same time using a shift amount and the prefix and suffix of the output bit string. The shift amount is calculated using an input value of the size of the region. The prefix and the suffix are calculated using an input value of the lowest value in the region and an input value of the number of non-output bits. Consequently, the normalization process can be rapidly performed without using a large-capacity memory.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Exemplary embodiments of the present invention will be described in detail with reference to the accompanying drawings.

Figure 1:
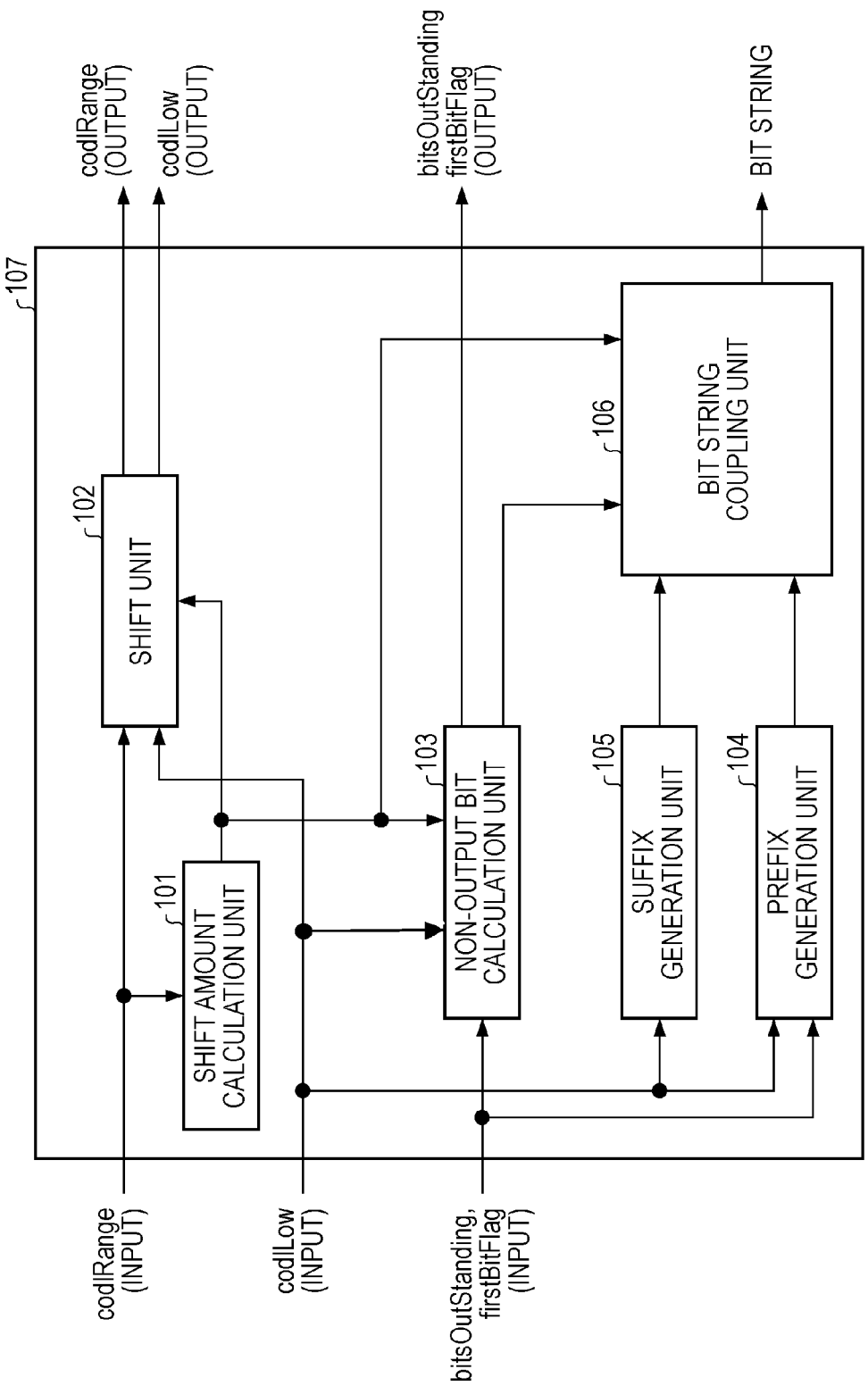
FIG. 1 is a diagram illustrating the configuration of a normalization processing apparatus according to an embodiment of the present invention.

FIG. 1 is a diagram illustrating the configuration of a normalization processing apparatus according to an embodiment of the present invention. Referring to FIG. 1, a normalization processing apparatus 107 according to an embodiment of the present invention is provided with a shift amount calculation unit 101, a shift unit 102, a non-output bit calculation unit 103, a prefix generation unit 104, a suffix generation unit 105, and a bit string coupling unit 106.

A 9-bit signal is input into the normalization processing apparatus 107 as the range on the number line codlRange. A 10-bit signal is input into the normalization processing apparatus 107 as the minimum coordinates in the range codlLow. A signal having a large number of bits is input into the normalization processing apparatus 107 as the number of non-output bits bitsOutStanding. A one-bit signal is input into the normalization processing apparatus 107 as the flag indicating whether an output bit is the first bit of a slice firstBitFlag.

The shift amount calculation unit 101 is a circuit for decoding the input value of codlRange and calculating a shift amount N. Here, the shift amount N is a value denoting the number of shifts performed in step S208 in the flowchart illustrated in FIG. 2.

The shift unit 102 is a barrel shifter circuit for individually shifting the input values of codIRange and codILow to the left in accordance with the shift amount N calculated by the shift amount calculation unit 101, and outputting the shifting results.

The non-output bit calculation unit 103 is a circuit for calculating the output values of bitsOutStanding and firstBitFlag based on the input values of codILow, firstBitFlag, and bitsOutStanding and the above-described shift amount N.

The prefix generation unit 104 is a circuit for calculating a prefix of an output bit string using the input values of bitsOutStanding, codILow, and firstBitFlag.

The suffix generation unit 105 is a circuit for calculating a suffix of the output bit string using the input value of codILow.

The bit string coupling unit 106 is a circuit for generating a bit string by combining the prefix calculated by the prefix generation unit 104 and the suffix calculated by the suffix generation unit 105, and outputting the generated bit string.

Next, the process of calculating the value of codIRange and the shift amount N will be described. In step S201 in FIG. 2, the value of codIRange is shifted to the left until it is determined that the value of codIRange is equal to or greater than 0x100. Accordingly, the shift amount N is represented by the following equation.

$$N = \text{Max}(8-X, 0)$$

Here, X denotes the maximum bit position of a bit whose bit value is 1 in codIRange expressed in binary notation.

Figure 5:
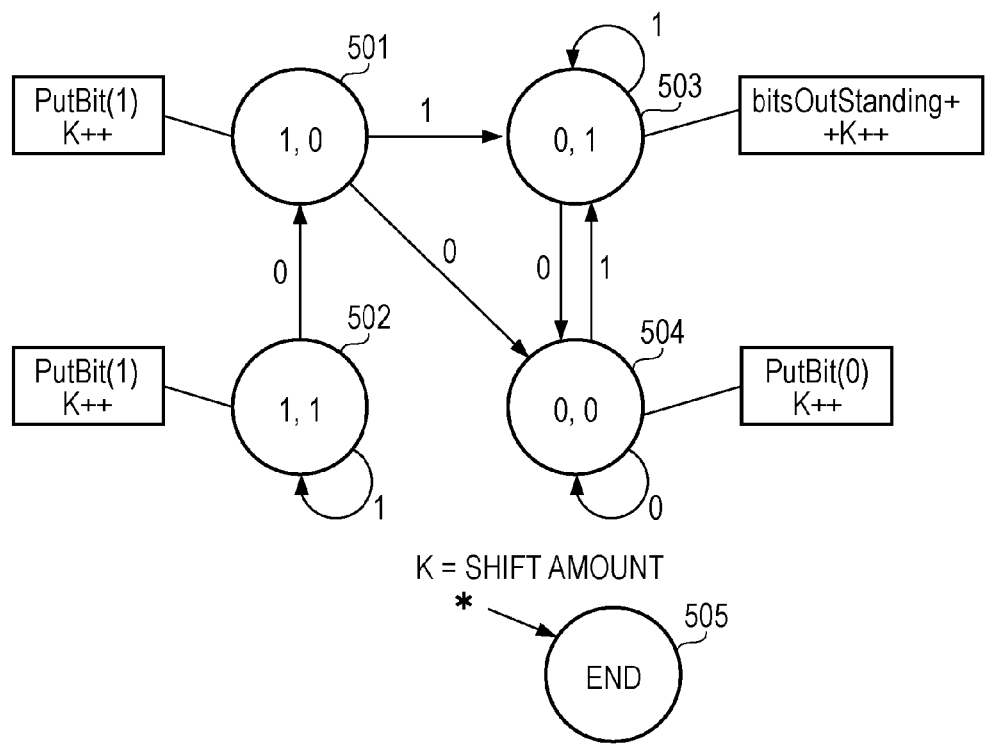
FIG. 5 is a state transition diagram illustrating the change in codlLow according to an embodiment of the present invention.

For example, as illustrated in FIG. 5, when codIRange=0b000001010, the maximum bit position of a bit whose bit value is 1 is the third bit counting from LSB. Accordingly, N=5 is obtained by substituting X=3 into the above-described equation.

Figure 4:
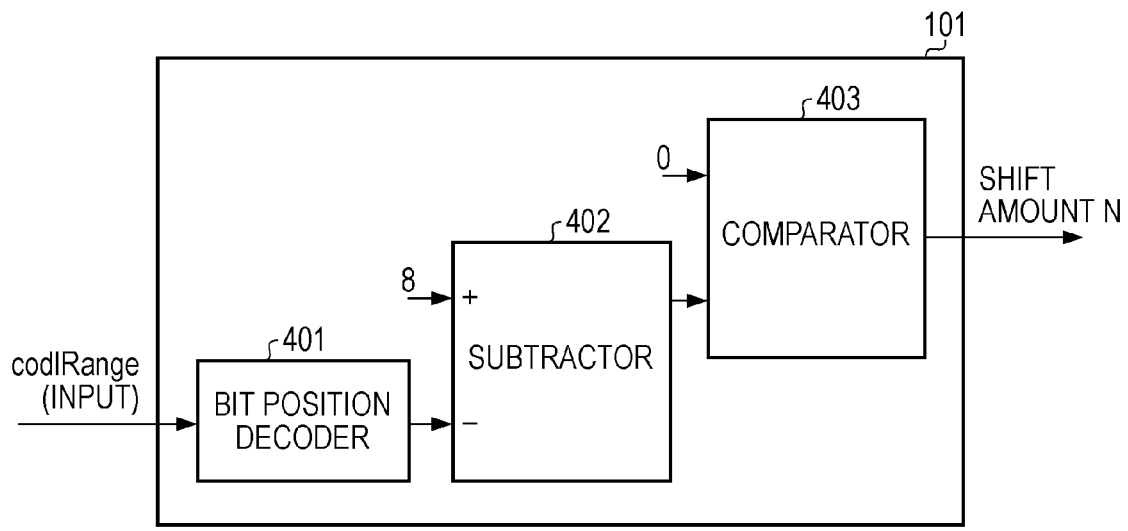
FIG. 4 is a diagram illustrating the configuration of a shift amount calculation unit according to an embodiment of the present invention.

The configuration of the shift amount calculation unit 101 is illustrated in FIG. 4. A bit position decoder 401 (hereinafter also referred to as a decoder) calculates the above-described value of X from codIRange, and inputs the calculated value of X into a subtractor 402. The subtractor 402 calculates the value of 8−X.

The value of 8−X is input into a comparator 403. The comparator 403 compares the value of 8−X with zero, and outputs either the value of 8−X or zero, whichever is greater, as the shift amount N. The shift amount N is input into the shift unit 102. The shift unit 102 shifts the value of codIRange to the left by N bits, and outputs the shifting result.

Figure 2:
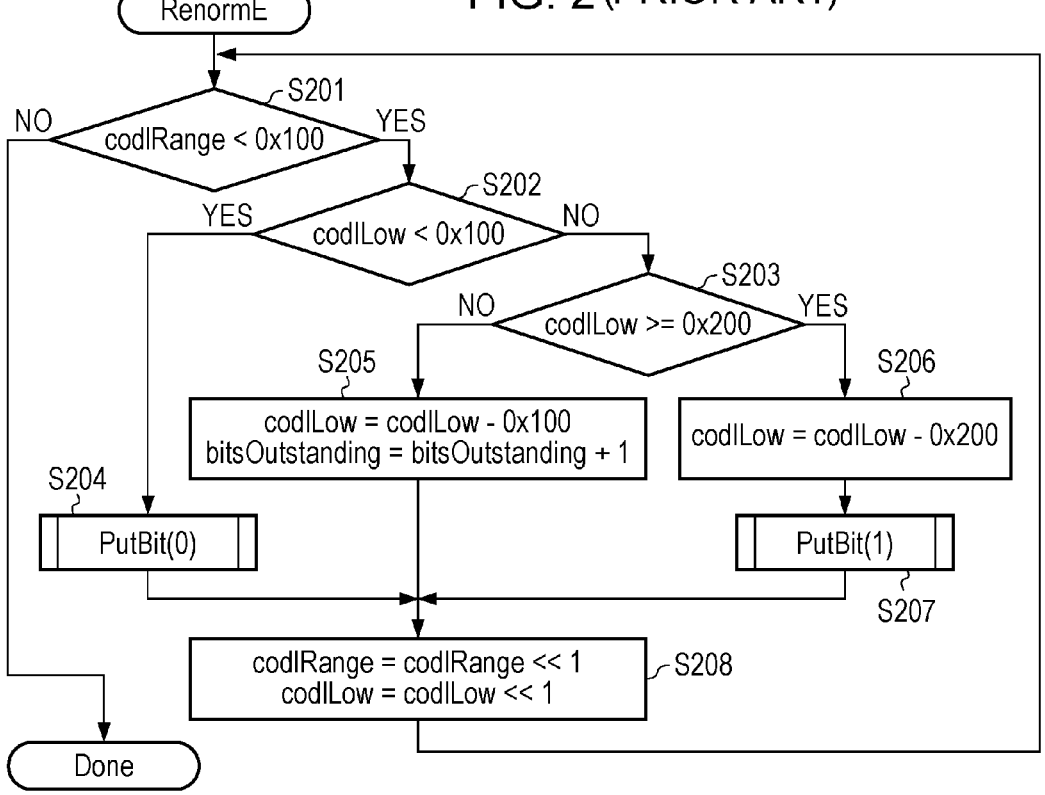
FIG. 2 is a flowchart illustrating a normalization process based on the CABAC method.

Next, the process of calculating the value of codILow will be described. The process of calculating the value of codILow in a single loop from step S202 to step S208 in FIG. 2 is represented as follows.

```
if codlLow < 0x100 then
    codlLow = codlLow << 1
else if codlLow < 0x200 then
    codlLow = (codlLow − 0x100) << 1
else
    codlLow = (codlLow − 0x200) << 1
```

Here, when focusing on two bits of codILow[9:8], the bit values of the two bits are one of the four types of bit values, 00, 01, 10, and 11. It is assumed that the bit values of the two bits of codILow[9:8] are defined as a current state and the bit values of codILow[7:7] are defined as a transition condition. In this case, the change in codILow is represented by a state transition diagram illustrated in FIG. 5.

Referring to the state transition diagram, a state 501 denotes a state in which the bit values of codILow[9:8] are 10, a state 502 denotes a state in which the bit values of codILow[9:8] are 11, a state 503 denotes a state in which the bit values of codILow[9:8] are 01, and a state 504 denotes a state in which the bit values of codILow[9:8] are 00.

A state 505 denotes an end state. An internal variable K is a variable that is incremented from an initial value of zero by one each time a state transition occurs. If the value of K reaches the shift amount N, the process proceeds to the state 505 in which the process ends.

If the shift amount N is zero, the process also proceeds to the state 505 in which the process ends. If the current state is the state 501, codILow>=0x200 is satisfied and the function PutBit(1) is therefore executed. Furthermore, codILow=codILow−0x200<<1 is satisfied, and the value of codILow[9:9] is therefore shifted to the left by one bit by changing the value of codILow[9:9] from 1 to 0.

Subsequently, if the value of current codILow[7:7] is 1, the process proceeds to the state 503. If the value of current codILow[7:7] is 0, the process proceeds to the state 504. If the current state is the state 502, codILow>=0x200 is satisfied and the function PutBit(1) is therefore executed. Furthermore, codILow=codILow−0x200<<1 is satisfied and the value of codILow[9:9] is therefore shifted to the left by one bit by changing the value of codILow[9:9] from 1 to 0.

Subsequently, if the value of current codILow[7:7] is 1, the process proceeds to the state 502. On the other hand, if the value of current codILow[7:7] is 0, the process proceeds to the state 501. If the current state is the state 503, 0x100<=codILow<0x200 is satisfied and the value of bitsOutStanding is therefore incremented. Furthermore, codILow=codILow−0x100<<1 is satisfied, and the value of codILow[8:8] is therefore shifted to the left by one bit by changing the value of codILow[8:8] from 1 to 0.

Subsequently, if the value of current codILow[7:7] is 1, the process proceeds to the state 503. On the other hand, if the value of current codILow[7:7] is 0, the process proceeds to the state 504. If the current state is the state 504, 0x100>codILow is satisfied and the function PutBit(0) is therefore executed.

Furthermore, codILow=codILow<<1 is satisfied and the one-bit left shift is therefore performed. Subsequently, if the value of current codILow[7:7] is 1, the process proceeds to the state 503. If the value of current codILow[7:7] is 0, the process proceeds to the state 504.

As is apparent from this state transition diagram, the value of current codILow[7:7] in the states 501, 502, 503, and 504 is always the same as the value of codILow[8:8] which is obtained after the state transition has been executed.

The value of codILow[7:0] which is obtained after the state transition has been executed is the same as a value obtained by shifting the value of codILow[6:0] to the left by one bit.

On the other hand, once the process proceeds to the states 503 and 504, the process cannot be returned to the states 501 and 502. Accordingly, if the value of codILow[9:9] is 1, it can be determined that the bit values of all bits of codILow[9:9-N] are 1.

Figure 6:
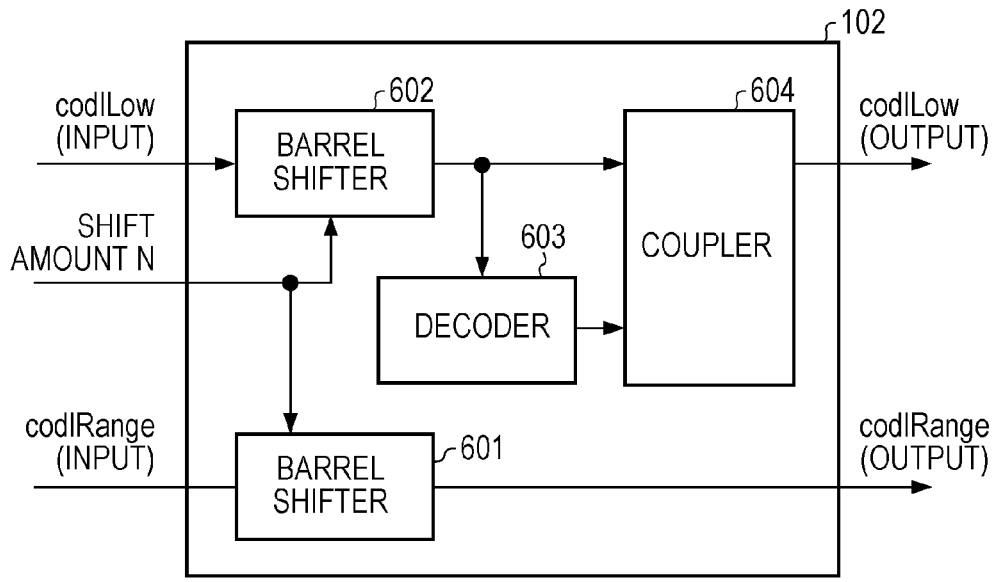
FIG. 6 is a diagram illustrating the configuration of a shift unit according to an embodiment of the present invention.

The configuration of the shift unit 102 is illustrated in FIG. 6. A barrel shifter 601 is used to shift the value of codIRange to the left by N bits. A barrel shifter 602 is used to shift the value of codILow to the left by N bits. A decoder circuit 603 is used to calculate the value of codILow[9:9] using the higher-order N+1 bits of an output of the barrel shifter 602.

The decoder circuit 603 calculates a logical AND between individual higher-order N+1 bits of the output of the barrel shifter 602, and outputs the calculation result.

A coupler circuit 604 combines the lower-order 9 bits of an output of the barrel shifter 602 and the output of the decoder circuit 603, and outputs the result of the combination as codlLow.

Next, the process of calculating the value of bitsOutStanding will be described. As is apparent from the flowchart illustrated in FIG. 3, the value of bitsOutStanding is cleared to zero by the PutBit function. Accordingly, the output value of bitsOutStanding is obtained as follows.

```
if N == M + 1 then
    bitsOutStanding = bitsOutStanding + M
else if N = 0 then
    bitsOutStanding = bitsOutStanding
else if N = M then
    bitsOutStanding = 0
else
    bitsOutStanding = M
```

Here, M is the sum of non-output bits which denotes the number of consecutive bits of 1 counted from a lower-order bit of codlLow[9:9-N].

Figure 3:
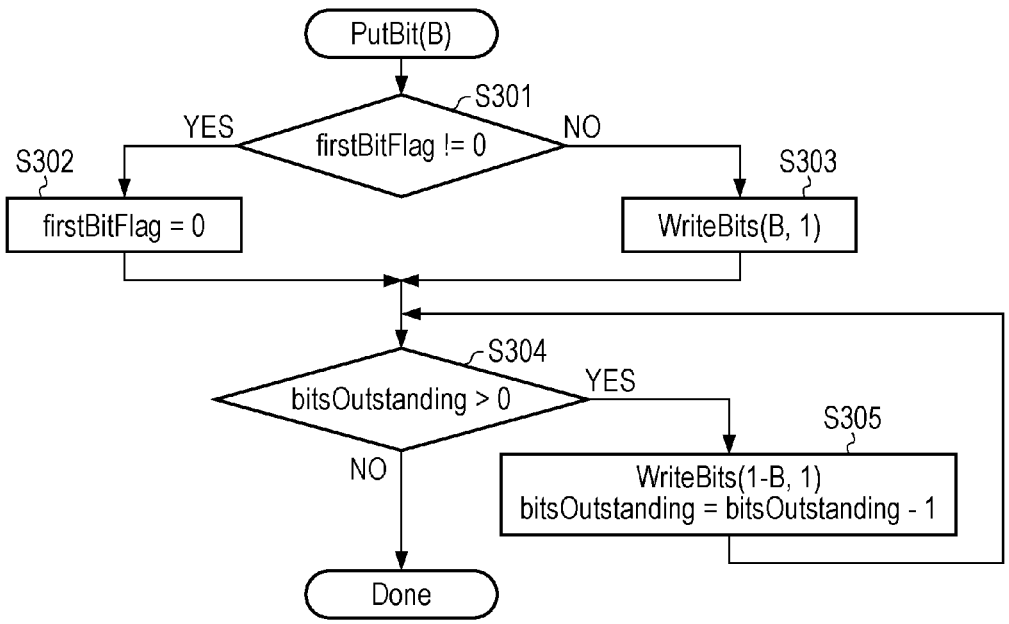
FIG. 3 is a flowchart illustrating a normalization process based on the CABAC method.

Furthermore, as is apparent from the flowchart illustrated in FIG. 3, the value of firstBitFlag is cleared to zero by the PutBit function. Accordingly, one bit of 1 is output as first-BitFlag in a case where the input value of firstBitFlag is 1 and the PutBit function has never executed. In the sate transition diagram illustrated in FIG. 5, the PutBit function has never executed when the values of codlLow[9:8] are always 01, that is, codlLow[9:9-N]=0b01111 . . . 1 is satisfied or the shift amount N is zero. The output value of firstBitFlag is represented by the following equations.

```
if N = 0 then
    firstBitFlag = firstBitFlag
else if N = M + 1 then
    firstBitFlag = firstBitFlag
else
    firstBitFlag = 0
```

Accordingly, by calculating the sum of non-output bits M using the value of codlLow, the values of bitsOutStanding and firstBitFlag can be calculated.

Figure 7:
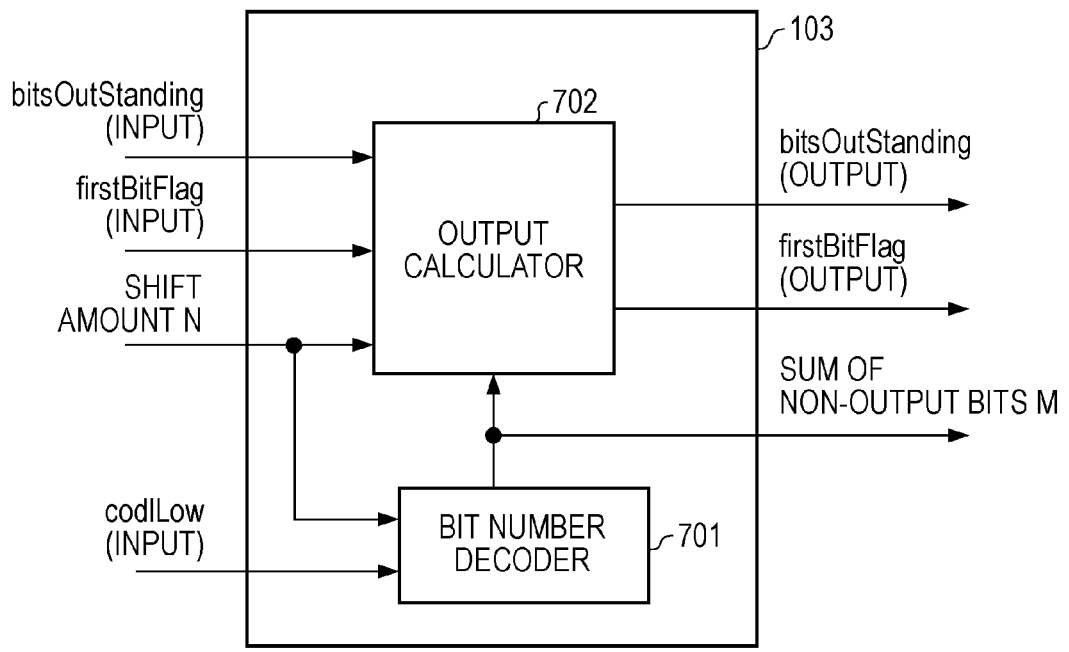
FIG. 7 is a diagram illustrating the configuration of a non-output bit calculation unit according to an embodiment of the present invention.

The configuration of the non-output bit calculation unit 103 is illustrated in FIG. 7. A bit number decoder circuit 701 is used to calculate the sum of non-output bits M using the input value of codlLow and the shift amount N. An output calculator circuit 702 is used to calculate the output values of bitsOutStanding and firstBitFlag using the input values of bitsOutStanding and firstBitFlag, the shift amount N, and the sum of non-output bits M.

Next, the process of calculating an output bit string will be described. First, the value of codlLow is represented as illustrated in FIG. 7. The number of consecutive bits of 1 counted from MSB is defined as P0, the number of next consecutive bits of 0 is defined as Q0, the number of next consecutive bits of 1 is defined as P1, and the number of next consecutive bits of 0 is defined as Q1.

For example if the value of codlLow is 0b1110001001, the value is represented by the following equations, P0=3, Q0=3, P1=1, Q1=2, P2=1, and Q2=0. If the value of codlLow is 0b0000011010, the value is represented by the following equations, P0=0, Q0=5, P1=2, Q1=1, P2=1, and Q2=1.

Referring to the state transition diagram illustrated in FIG. 5, the function PutBit(1) is executed P0 times in the range in which the number of transitions does not exceed the shift amount N. Subsequently, the function PutBit(0) is executed Q0−1 times in the range in which the number of transitions does not exceed the shift amount N. Subsequently, the value of bitsOutStanding is incremented P1 times in the range in which the number of transitions does not exceed the shift amount N.

Subsequently, each time the bit of 0 appears, the function PutBit(0) is executed in the range in which the number of transitions does not exceed the shift amount N. Each time the bit of 1 appears, the value of bitsOutStanding is incremented. For example, if N=7 and codlLow=0b1110001001, the processing operations, PutBit(1), PutBit(1), PutBit(1), PutBit(0), PutBit(0), bitsOutStanding++, and PutBit(0), are performed during normalization processing.

In this case, an output bit string is generated as follows in accordance with the procedure illustrated in the flowchart in FIG. 3. If the input value of firstbitFlag is 0, one bit of 1 is output. Subsequently, the number of bits of 0 which is represented by the input value of bitsOutStanding is output. Subsequently, two bits of 1 are output. Subsequently, two bits of 0 are output. Subsequently, the value of bitsOutStanding is set to one. Subsequently, one bit of 0 is output. Subsequently, one bit of 1 is output. For example, if the input value of firstBit-Flag is zero and the value of bitsOutStanding is three, an output bit string 1,0,0,0,1,1,0,0,0,1 is obtained.

Here, the first four bits included in the output bit string are changed in accordance with the input values of bitsOutStanding and firstBitFlag. This part is referred to as a prefix, and the remaining part is referred to as a suffix.

The prefix is calculated as follows. If the value of firstbit-Flag is one, the bit value of codlLow[9:9] is inverted and the prefix is generated by connecting bits of the inverted bit value. The number of bits to be connected is the same as the number represented by the input value of bitsOutStanding. If the value of firstbitFlag is zero, the prefix is generated by connecting one bit of the bit value of codlLow[9:9] and bits of the inverted bit value. The number of bits of the inverted bit value to be connected is the same as the number represented by the input value of bitsOutStanding.

The prefix generation unit 104 receives firstBitFlag and codlLow, and outputs the following value.

Figure 8:
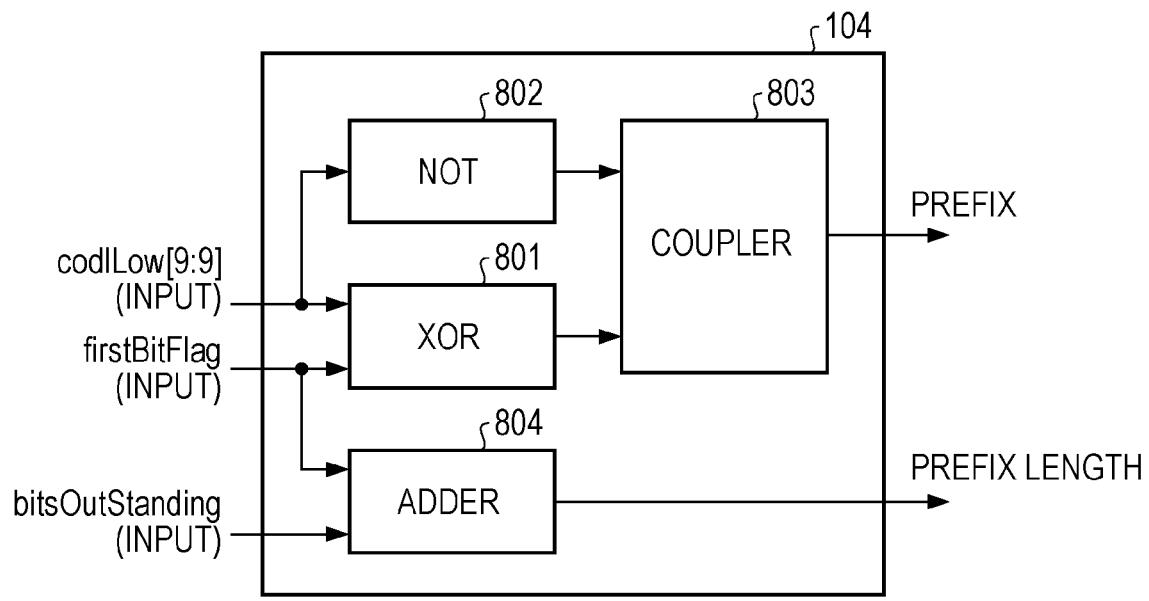
FIG. 8 is a diagram illustrating the configuration of a prefix generation unit according to an embodiment of the present invention.

The configuration of the prefix generation unit 104 is illustrated in FIG. 8. An XOR circuit 801 is used to obtain a logical exclusive OR between the most significant bit of codlLow and the bit of firstBitFlag. A NOT circuit 802 is used to obtain the inverted value of the most significant bit of codlLow.

A coupler circuit 803 receives a bit output from the XOR circuit 801 and a bit output from the NOT circuit 802, sets the bit output from the XOR circuit 801 as the most significant bit of the prefix, uses the bit output from the NOT circuit 802 as each of the remaining bits of the prefix, and outputs the generated prefix.

An adder circuit (adder) 804 adds the value of firstBitFlag and the value of bitsOutStanding, and outputs the addition result as a prefix length Length.

The suffix is obtained by removing the most significant bit from codlLow that has been input. In this embodiment, the suffix generation unit 105 is a one-bit left shifter circuit.

Figure 9:
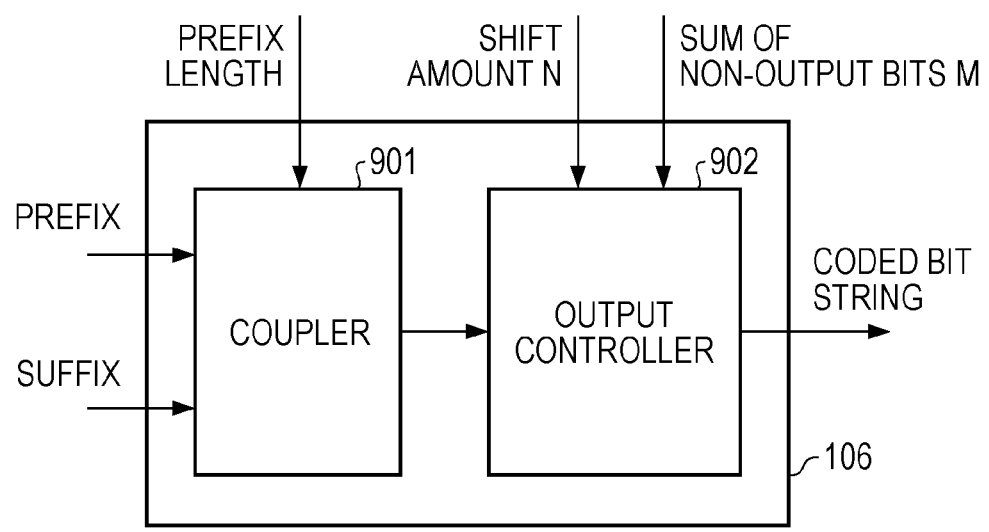
FIG. 9 is a diagram illustrating the configuration of a bit string coupling unit according to an embodiment of the present invention.
Figure 10:
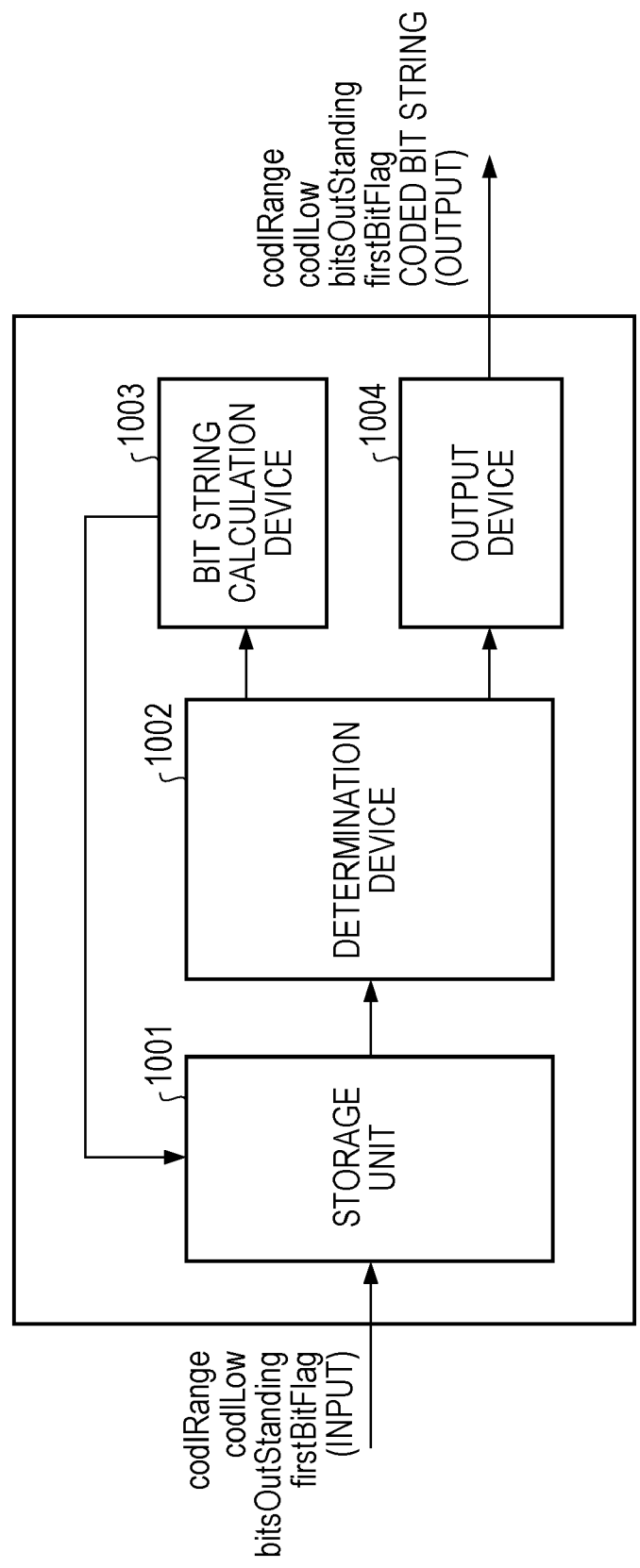
FIG. 10 is a diagram illustrating the configuration of a known normalization processing apparatus.

Next, the operations of the bit string coupling unit 106 will be described. The configuration of the bit string coupling unit 106 is illustrated in FIG. 9. A coupler circuit (coupler) 901 receives the prefix and the prefix length Length which have been calculated by the prefix generation unit 104 and the suffix calculated by the suffix generation unit 105, and combines the prefix and the suffix so that the prefix is followed by the suffix.

An output controller circuit 902 receives the bit string and the prefix length Length which have been output from the coupler circuit 901, the shift amount N calculated by the shift amount calculation unit 101, and the sum of non-output bits M calculated by the non-output bit calculation unit 103, extracts some bits from the bit string, and outputs the extracted bits. The number of output bits BitNum is calculated using the following equations.

```
if (N = M + 1) OR (N = 0) then
    BitNum = 0
else if N = M then
    BitNum = Length + N − 1
else
    BitNum = Length + N − M − 1
```

The output controller circuit 902 calculates the number of output bits BitNum using the above equations, extracts from the bit string the number of higher-order bits which is represented by BitNum, and outputs the extracted bits. The above-described processing operations can be performed in one cycle using a simple combinational circuit of a decoder, a shifter, an adding and subtracting circuit, a selective circuit, etc.

As described previously, in an embodiment of the present invention, the shift amount N, the sum of non-output bits M, the prefix, and the suffix are calculated using the input values of codIRange, codILow, bitsOutStanding, and firstBitFlag. Accordingly, the output values of codIRange, codILow, bitsOutStanding, and firstBitFlag, and an output bit string can be calculated without performing a process repeatedly. That is, in arithmetic coding, normalization processing can be rapidly performed upon all pieces of corresponding data at the same time.

In this embodiment, firstBitFlag is input into a normalization processing apparatus. The value of firstBitFlag becomes one only when an output bit is the first bit of a slice. Accordingly, an output bit string may be calculated without inputting firstBitFlag into the normalization processing apparatus on the assumption that the output bit value is zero, and the first bit of a slice may be changed by an external unit of the normalization processing apparatus.

In this embodiment, a bit string coupling unit contains a unit for calculating the number of output bits using the sum of non-output bits calculated by the non-output bit calculation unit 103 and the shift amount calculated by the shift amount calculation unit 101. However, the calculation of the number of output bits may be performed by another unit. For example, the calculation of the number of output bits may be performed in the non-output bit calculation unit. The bit string coupling unit may output a bit string based on the calculation result.

In this embodiment, the bit string coupling unit 106 combines the prefix and the suffix using the prefix length calculated by the prefix generation unit 104. However, the calculation of the prefix length may be performed by another unit. For example, the calculation of the prefix length may be performed in the bit string coupling unit.

In this embodiment, the suffix generation unit 105 is a one-bit shifter. However, the suffix generation unit 105 may be another circuit such as a bit extraction circuit.

A storage medium storing program code (software) capable of achieving the functions of the above-described embodiments may be used. In this case, the storage medium is provided to a system or an apparatus. The computer (CPU or MPU) of the system or apparatus reads out the program code from the storage medium and executes the read program code, and the functions of the above-described embodiments can be achieved.

In this case, the program code itself read out from the storage medium achieves the functions of the above-described embodiments. Accordingly, the present invention can be applied to the program code and the storage medium storing the program code.

The storage medium for supplying the program code may be, for example, a flexible disk, a hard disk, an optical disc, a magneto-optical disk, a CD-ROM, a CD-R, a magnetic tape, a non-volatile memory card, or a ROM.

An OS (a basic system or an operating system) or the like running on a computer may perform a part of or all of the processing in accordance with the instructions of the program code.

Furthermore, the program code read out from the storage medium may be written in the memory of a function expansion board inserted into a computer or a function expansion unit connected to a computer. In this case, a CPU included in the function expansion board or the function expansion unit may perform a part of or all of the processing in accordance with the instructions of the program code.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

What is claimed is:

1. A normalization processing apparatus for receiving an input value of a size of a region on the number line which is determined based on an occurrence probability value of a current symbol, an input value of a lowest value in the region, and an input value of a number of non-output bits, and performing normalization processing in arithmetic coding using the received input values, the normalization processing apparatus comprising:

a shift amount calculation unit configured to calculate a shift amount required for the input value of the size of the region to become equal to or greater than a setting value;

a shift unit configured to perform shift processing upon the input value of the size of the region and the input value of the lowest value in the region based on the calculated shift amount;

a prefix generation unit configured to calculate a prefix of an output bit string using the input value of the number of non-output bits and the input value of the lowest value in the region;

a suffix generation unit configured to calculate a suffix of the output bit string using the input value of the lowest value in the region;

a non-output bit calculation unit configured to calculate an output value of the number of non-output bits using the input value of the number of non-output bits, the input value of the lowest value in the region, and the calculated shift amount; and a bit string coupling unit configured to combine the prefix and the suffix to generate the output bit string using the calculated shift amount and the output value of the number of non-output bits, and to output the generated output bit string.

2. The normalization processing apparatus according to claim 1, further comprising a receiving unit configured to receive an input value of a first bit flag indicating whether an output bit is a first output bit, and wherein the non-output bit calculation unit calculates an output value of the first bit flag using the input value of the lowest value in the region and the calculated shift amount.

3. The normalization processing apparatus according to claim 1, wherein the shift amount calculation unit includes a decoder configured to calculate a position of a bit nearest to the Most Significant Bit, a bit value of the bit being one when the input value of the size of the region is expressed in binary notation.

4. The normalization processing apparatus according to claim 1, wherein the non-output bit calculation unit includes a decoder configured to calculate a position of a bit nearest to the Least Significant Bit, a bit value of the bit being zero when the input value of the lowest value in the region is expressed in binary notation.

5. The normalization processing apparatus according to claim 1, wherein the prefix generation unit calculates, using the most significant bit of the lowest value in the region, the prefix including the most significant bit and the remaining bits the number of which is the same as the number of non-output bits.

6. The normalization processing apparatus according to claim 1, wherein the suffix generation unit outputs a part of a bit string of the lowest value in the region as the suffix.

7. The normalization processing apparatus according to claim 1, wherein the bit string coupling unit combines the prefix and the suffix using a value of a prefix length calculated using the input value of the number of non-output bits.

8. The normalization processing apparatus according to claim 1, further comprising a calculator configured to calculate the number of output bits using the calculated shift amount and the output value of the number of non-output bits, and wherein the bit string coupling unit extracts bits the number of which is the same as the number of output bits from the bit string obtained by combining the prefix and the suffix, and outputs the extracted bits.

* * * * *